(12) United States Patent
Fay et al.

(10) Patent No.: US 12,230,583 B2
(45) Date of Patent: Feb. 18, 2025

(54) INTERPOSERS FOR MICROELECTRONIC DEVICES

(71) Applicant: Micron Technology, Inc., Boise, ID (US)

(72) Inventors: Owen Fay, Meridian, ID (US); Chan H. Yoo, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 18/381,061

(22) Filed: Oct. 17, 2023

(65) Prior Publication Data

US 2024/0120283 A1     Apr. 11, 2024

Related U.S. Application Data

(63) Continuation of application No. 17/682,734, filed on Feb. 28, 2022, now Pat. No. 11,824,010, which is a (Continued)

(51) Int. Cl.
*H01L 23/538*     (2006.01)
*H01L 21/48*     (2006.01)
(Continued)

(52) U.S. Cl.
CPC ...... *H01L 23/5389* (2013.01); *H01L 21/4857* (2013.01); *H01L 21/486* (2013.01);
(Continued)

(58) Field of Classification Search
CPC . H01L 23/481; H01L 21/4857; H01L 21/486; H01L 21/823475; H01L 23/147;
(Continued)

(56) References Cited

U.S. PATENT DOCUMENTS 5,126,279 A     6/1992    Roberts
7,619,441 B1    11/2009   Rahman et al.
(Continued)

FOREIGN PATENT DOCUMENTS

CN     104409424 A     3/2015
CN     104576567 A     4/2015
(Continued)

OTHER PUBLICATIONS

"Chinese Application Serial No. 201911194043.7, Office Action mailed Aug. 17, 2023", with English translation, 14 pages.
(Continued)

*Primary Examiner* — Brook Kebede
(74) *Attorney, Agent, or Firm* — Schwegman Lundberg & Woessner, P.A.

(57) ABSTRACT

Described are semiconductor interposer, and microelectronic device assemblies incorporating such semiconductor interposers. The described interposers include multiple redistribution structures on each side of the core; each of which may include multiple individual redistribution layers. The interposers may optionally include circuit elements, such as passive and/or active circuit. The circuit elements may be formed at least partially within the semiconductor core.

20 Claims, 9 Drawing Sheets

Related U.S. Application Data continuation of application No. 16/696,423, filed on Nov. 26, 2019, now Pat. No. 11,264,332.

(60) Provisional application No. 62/772,291, filed on Nov. 28, 2018.

(51) Int. Cl.
*H01L 21/8234* (2006.01)
*H01L 23/00* (2006.01)
*H01L 23/14* (2006.01)
*H01L 25/18* (2023.01)

(52) U.S. Cl.
CPC .... *H01L 21/823475* (2013.01); *H01L 23/147* (2013.01); *H01L 23/5383* (2013.01); *H01L 24/19* (2013.01); *H01L 24/24* (2013.01); *H01L 24/25* (2013.01); *H01L 25/18* (2013.01); H01L 2224/24137 (2013.01); H01L 2224/24146 (2013.01); H01L 2224/2518 (2013.01); H01L 2924/1431 (2013.01); H01L 2924/1436 (2013.01); H01L 2924/1437 (2013.01); H01L 2924/1438 (2013.01); H01L 2924/1443 (2013.01)

(58) Field of Classification Search
CPC . H01L 23/5383; H01L 23/5389; H01L 24/05; H01L 24/16; H01L 24/19; H01L 24/24; H01L 24/25; H01L 25/16; H01L 25/18; H01L 25/50

See application file for complete search history.

(56) References Cited

U.S. PATENT DOCUMENTS

| | | | |
|---|---|---|---|
| 8,203,213 | B2 | 6/2012 | Lee et al. |
| 8,703,599 | B2 | 4/2014 | Fee |
| 9,153,508 | B2 | 10/2015 | Partsch |
| 9,607,967 | B1 | 3/2017 | Shih |
| 9,917,026 | B2 | 3/2018 | Oikawa et al. |
| 10,770,398 | B2 | 9/2020 | Yoo et al. |
| 11,264,332 | B2 | 3/2022 | Fay et al. |
| 11,824,010 | B2 | 11/2023 | Fay et al. |
| 2011/0024172 | A1 | 2/2011 | Maruyama et al. |
| 2013/0105213 | A1 | 5/2013 | Hu et al. |
| 2013/0141442 | A1 | 6/2013 | Brothers et al. |
| 2013/0252378 | A1 | 9/2013 | Jeng et al. |
| 2014/0001639 | A1 | 1/2014 | Hiraishi et al. |
| 2014/0021594 | A1 | 1/2014 | Yew et al. |
| 2014/0070406 | A1 | 3/2014 | Mohammed et al. |
| 2014/0089609 | A1 | 3/2014 | Kegel et al. |
| 2014/0126274 | A1 | 5/2014 | Lee et al. |
| 2014/0344644 | A1 | 11/2014 | Resnick |
| 2015/0028918 | A1 | 1/2015 | Hutton |
| 2015/0046612 | A1 | 2/2015 | Gupta |
| 2015/0123265 | A1 | 5/2015 | Lowney et al. |
| 2015/0262972 | A1 | 9/2015 | Katkar et al. |
| 2015/0287672 | A1* | 10/2015 | Yazdani ............ H01L 23/49827 257/774 |
| 2016/0085899 | A1 | 3/2016 | Qian et al. |
| 2016/0120143 | A1 | 5/2016 | Hofman et al. |
| 2017/0077076 | A1 | 3/2017 | Wang et al. |
| 2018/0102776 | A1 | 4/2018 | Chandrasekar et al. |
| 2018/0158771 | A1 | 6/2018 | Akiba et al. |
| 2018/0358280 | A1 | 12/2018 | Gandhi et al. |
| 2019/0287956 | A1 | 9/2019 | Raorane et al. |
| 2020/0168554 | A1 | 5/2020 | Fay et al. |
| 2020/0303363 | A1 | 9/2020 | Yoo et al. |
| 2022/0254723 | A1 | 8/2022 | Fay et al. |

FOREIGN PATENT DOCUMENTS

| | | |
|---|---|---|
| CN | 107393900 A | 11/2017 |
| CN | 111244053 A | 6/2020 |
| TW | 201411802 A | 3/2014 |

OTHER PUBLICATIONS

"Chinese Application Serial No. 201911194043.7, Decision of Rejection mailed Jan. 5, 2024", with machine English translation, 14 pages.
"Chinese Application Serial No. 201911194043.7, Office Action mailed Feb. 15, 2023", with machine English translation, 16 pages.
Hu, Dyi-Chung, et al., "2/2um Embedded Fine Line Technology for Organic Interposer Applications", 2016 IEEE 66th Electronic Components and Technology Conference, (2016), 7 pgs.

* cited by examiner

INTERPOSERS FOR MICROELECTRONIC DEVICES

PRIORITY APPLICATION

This application is a continuation of U.S. application Ser. No. 17/682,734, filed Feb. 28, 2022, which is a continuation of U.S. application Ser. No. 16/696,423, filed Nov. 26, 2019, now issued as U.S. Pat. No. 11,264,332, which claims the benefit of priority to U.S. Provisional Application Ser. No. 62/772,291, filed Nov. 28, 2018, all of which are incorporated herein by reference in their entirety.

TECHNICAL FIELD

Embodiments described herein relate generally to interposers for electrically connecting multiple microelectronic devices in an assembly; and more specifically relate to interposers formed relative to a semiconductor material, and structured to establish resistance to physical stress. Interposers in accordance with the present description may also be adapted, in some embodiments, to provide high bandwidth communication channels between microelectronic devices attached to the interposer.

BACKGROUND

Many forms of microelectronic devices such as IC (integrated circuit) assemblies include multiple semiconductor die (also, referred to herein as "die") or assemblies of such die physically and electrically connected to one another through an interposer. In some cases, such assembly on the interposer may be termed a "Multi-Chip Package" or "MCP." In some examples, the interposer may include a redistribution structure (sometimes termed in the art a "redistribution layer" or "RDL," as discussed further below) configured to establish interconnections between two or more of the multiple die within the assembly, and also to facilitate electrical and mechanical attachment to other devices (for example, a printed circuit board, such as a motherboard, or another structure).

Such an RDL may include one or more dielectric layers, each dielectric layer supporting a level of conductive material defining conductive traces and vias extending through the respective dielectric layer to connect, directly or indirectly, with respective contacts on one or more semiconductor die and/or with vias in other layers of the RDL, to redistribute the die contacts to other locations on or within the interposer.

Interposers can be constructed with a core structure including either a non-organic material, such as a semiconductor material, such as silicon (generally termed a "silicon interposer"), or any one (or more) organic materials (generally termed an "organic interposer"). The term "semiconductor interposer" is used herein to identify an interposer having a core formed of a semiconductor material, which may be either an elemental material (such as e.g., silicon, germanium selenium, etc., as known to persons skilled in the art), or a compound semiconductor (such as, e.g. gallium arsenide, indium gallium arsenide, also as known to persons skilled in the art). The term "non-organic interposer" is used to identify a core formed of a non-organic material which may be, for example, a semiconductor material, a glass material and/or a ceramic material. For purposes of providing examples herein, the discussed semiconductor interposers will be described in the form of silicon interposers.

Under conventional processing, organic interposers tend to be more resilient, and therefore more resistant to cracking or other damage resulting from physical or thermal stresses. Though That resistance to physical or thermal stresses is somewhat offset, however, by organic interposers typically having a different coefficient of thermal expansion ("CTE") from that of the semiconductor die or assemblies that will be attached to the interposer, thereby having a susceptibility to generating physical stress at the die attachment. Current commercially viable technology for forming organic interposers has difficulty providing line spacings of less than about 10/10μ LS. This current practical limitation leaves a significant gap relative to conventional silicon processing that forms the basis of manufacturing the majority of semiconductor die. As a result, current commercially viable processes for forming organic interposers cannot match the minimum contact spacing of semiconductor die that would desirably be attached to the interposer.

Additionally, interposers are of increasing importance in some high bandwidth applications. One example application, which is described in the specification, includes high bandwidth communications between memory devices and a processor. In some cases, the memory device may be an individual semiconductor die, but increasingly, the memory device may include a vertical stack of interconnected memory die, in some cases further stacked with a logic and/or interface die. In order to obtain full benefit of such multi-die memory devices, a processor must be able to access multiple portions of the interconnected die in parallel, thereby requiring high-speed parallel communication channels for data, command, and control signals between the processor and the multi-die memory device.

To meet design criteria for such communications, including conductive trace resistance and inter-trace capacitance, interposers are projected to require tighter line spacing ("L/S"), of less than 5/5μ LS, and preferably on the order of 2/2μ LS or smaller. Semiconductor interposers, for example silicon interposers, benefit from being processed by conventional semiconductor methods, and thus semiconductor interposers (such as such silicon interposers) can provide such L/S capability.

The present disclosure addresses interposer structures that can be configured, in some examples, for providing such high bandwidth communication. The interposer structures can also be implemented, in some examples, in a manner to reduce susceptibility to stress damage to the interposer. As described herein, these interposer structures can also be implemented, in some examples, to incorporate circuit components in the interposer, as may be used to further enhance performance of the microelectronic device assembly incorporating the interposer.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIGS. 1A-1B depicts example microelectronic devices, in which FIG. 1A depicts a microelectronic device assembly formed on an interposer as described in more detail in relation to other figures; and FIG. 1B depicts an example memory device as may be used in the assembly of FIG. 1A.

DESCRIPTION OF EMBODIMENTS

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

As described in more detail below, the specification describes various embodiments for forming a semiconductor interposer. Embodiments include various configurations of interposers including a semiconductor core, such as a silicon core, and multiple redistribution structures on each side of the core. In many embodiments, the redistribution structures will include multiple individual redistribution layers. The multiple individual redistribution layers may be implemented, in some examples, to provide high bandwidth communication capability between microelectronic devices connected through the interposer; and/or to provide an interposer structure of improved resistance to cracking or other failure. Described are multiple alternatives for constructing the redistribution layers to promote one or both of these objectives.

Additionally, the specification describes incorporation of circuit elements, including passive and/or active circuit elements that may be formed in the interposer. In many examples, the circuit elements will be formed at least in part in the semiconductor core. In some examples, circuit elements may have one or more bodies formed within the semiconductor core and one or more bodies formed in material structures formed over the core.

Figure 1A:
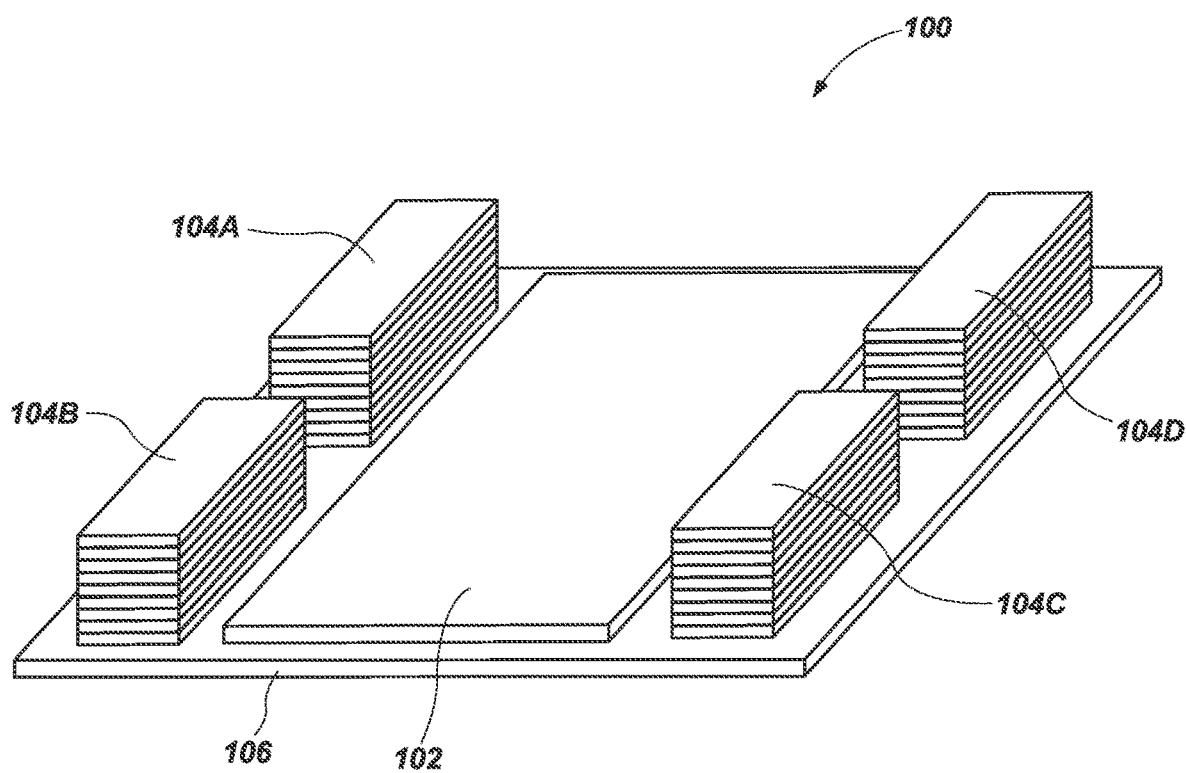
Figure 1B:
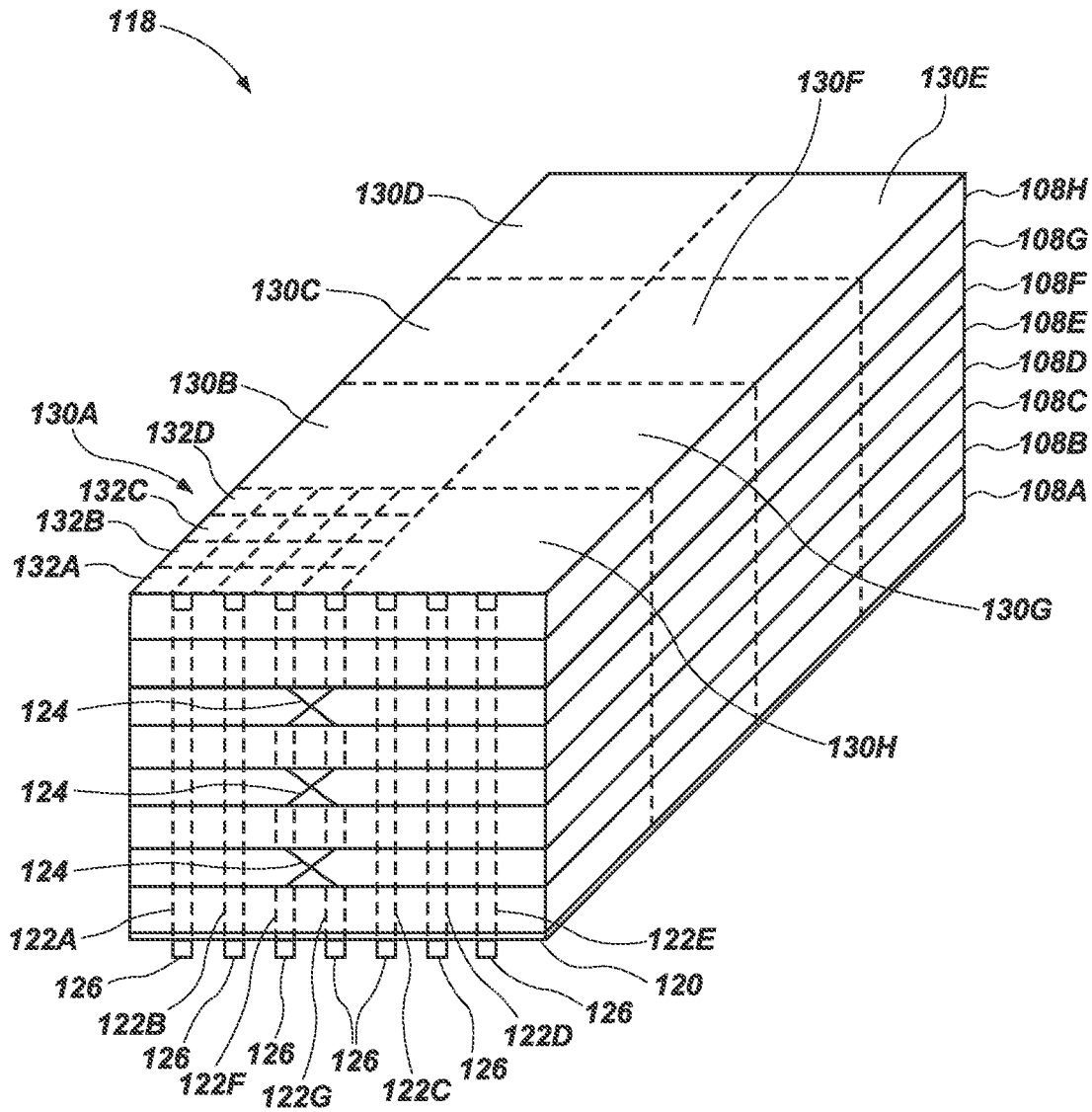

Referring now to the drawings in more detail, and particularly to FIGS. 1A-1B, FIG. 1A depicts a simplified representation of an example microelectronic device assembly 100 including a processor 102 and multiple memory devices 104A, 104B, 104C, 104D, connected to an interposer 106 formed in accordance with one or more of the example interposer configurations described herein.

As will be apparent to persons skilled in the art, processor 102 can be any of multiple configurations of a processor (e.g., a central processing unit (CPU), a graphics processing unit (GPU), a controller), or a system on a chip (SoC), or some other form of host device. Memory devices 104A, 104B, 104C, 104D can be of the same or different forms; and any of the memory devices can be either a single die or a stack of interconnected memory die, as discussed in more detail in reference to FIG. 1B. The representation of FIG. 1A depicts each memory device 104A, 104B, 104C, 104D as a stack of multiple memory die 108. In some examples, the devices coupled to interposer 100 may all be of comparable heights.

The processor 102 may exchange information with one or more of memory devices 104A, 104B, 104C, 104D using signals communicated over signal paths formed at least in part within interposer 106. Such signal paths include a path that a message or transmission may take in communicating from a transmitting component to a receiving component. In some cases, a signal path may be a conductor coupled with at least two components, where the conductor allows electrons to flow between the at least two components. In some cases, the signal path may be formed at least in part in a wireless medium as in the case for wireless communications (e.g., radio frequency (RF) or optical). In some examples, interposer 106 will be coupled to an external structure, such as a package substrate, a motherboard, etc., to form part of a larger system as discussed herein in reference to FIG. 8.

In some applications, microelectronic device assembly 100 may benefit from a high-speed connection between the processor 102 and one or more of memory devices 104A, 104B, 104C, 104D. As a result, in some examples, one or more of memory devices 104A, 104B, 104C, 104D will support applications, processes, or processors that have multiple terabytes per second (TB/s) bandwidth needs. Such applications may include a serializer/deserializer ("SerDes") between the memory and a processor or other logic devices, requiring high bandwidth. Satisfying such a bandwidth constraint within an acceptable energy budget may pose challenges in certain contexts.

The memory devices 104A, 1046, 104C, 104D and interposer 106 may be configured such that the signal path between memory cells in the memory devices 104A, 1046, 104C, 104D and the processor 102 are as short as the material properties, operating environment, component layout, and application allow. For example, the memory devices 104A, 1046, 104C, 104D may be bufferless memory devices with a point-to-point connection between the host device and the memory array. In other examples, the data channels coupling a memory device 104A, 1046, 104C, 104D with the processor 102 may comprise a point-to-many configuration, with one pin of the processor 102 coupled with corresponding pins of at least two memory arrays (which may be located in the same or different memory die 108, and/or memory devices 104A-104D).

Figure 5:
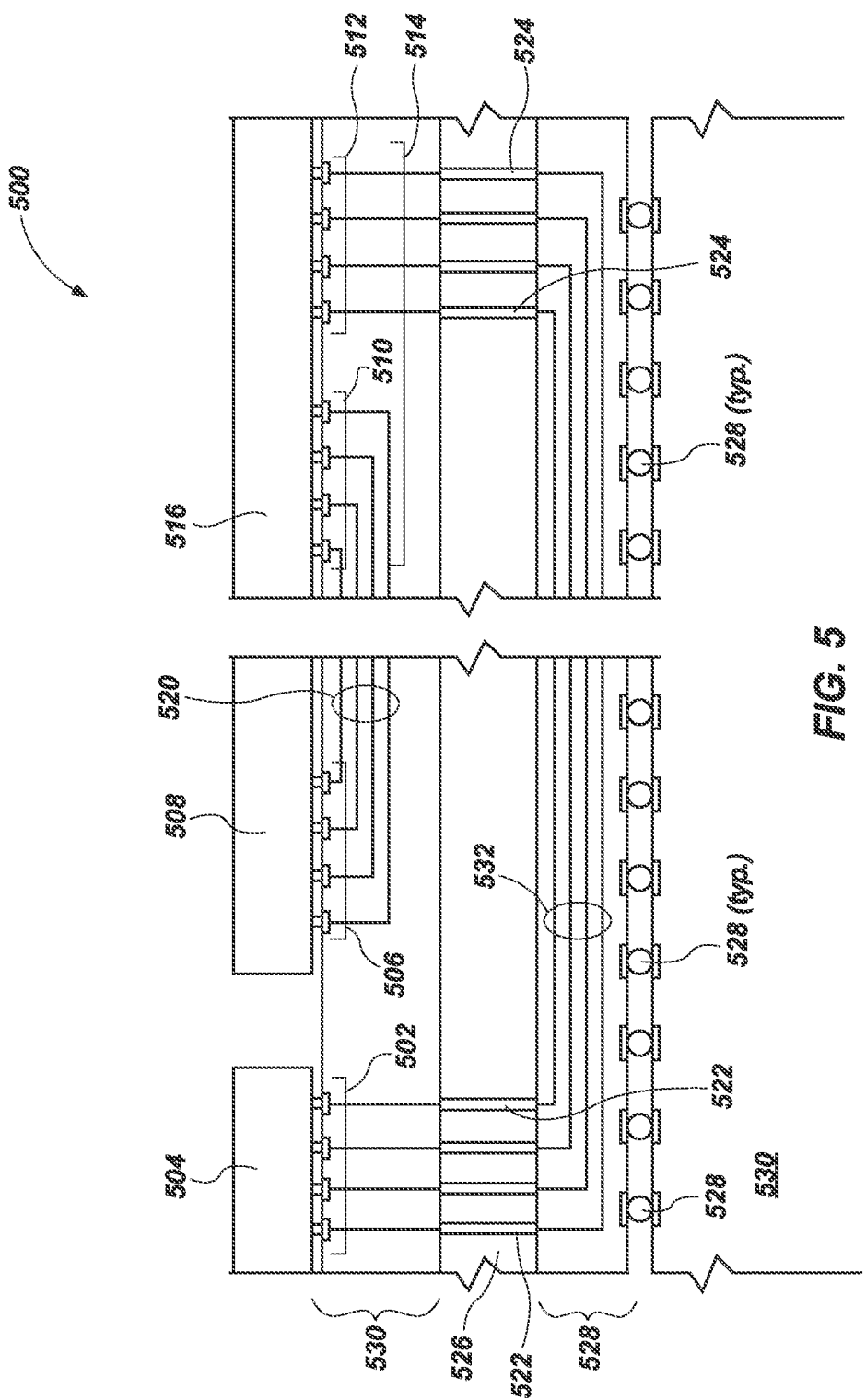
FIG. 5 depicts an example section of an interposer coupled to multiple microelectronic devices, showing an example signal routing between such devices.

As discussed in more detail in reference to FIG. 5, many interposers may be formed to have multiple arrays of contacts configured to interconnect with each of multiple devices (such as, in the example of FIG. 1A, processor 102 and memory devices 104A-104D). For purposes of the present description, each of the depicted devices is coupled to interposer 106 at a respective mounting site; and at each mounting site interposer 106 includes one or more arrays of contacts arranged and configured to engage complementary arrays of contacts on each of processor 102 and memory devices 104A-104D).

FIG. 16 depicts an example memory device 118 suitable for use in microelectronic device assembly 100 of FIG. 1A. Memory device 118 includes, as an example, eight individual memory die 108A-108H, that are vertically stacked and interconnected. As noted previously, memory device 118 could include only a single memory die, or any other number of stacked memory die for example, two memory die, four memory die, and/or more than eight memory die.

One example structure for forming the vertical interconnections includes multiple through silicon vias ("TSVs"). Though the term "through silicon vias" ("TSVs") taken literally suggests vias that extend through a silicon body, the term is conventionally used in the art to refer to vertical interconnects extending through not only silicon, and not only semiconductors, but to vertical interconnects extending through other materials as well. The term is used herein in this broader meaning, and as used herein does not imply that the described vias extend through a silicon body.

Each memory die 108 includes multiple memory cells that are programmable to store different logic states. For example, each memory cell may be programmed to store one or more logic states (e.g., a logic '0', a logic '1', a logic '00', a logic '01', a logic '10', a logic '11'). The memory die may use one or more of different storage technologies to store data including DRAM, SRAM, ferroelectric RAM (FeRAM), Resistive RAM (RRam or ReRAM), phase change memory (PCM), 3D XPoint™ memory, NAND memory, NOR memory, or other memory technologies known to persons skilled in the art, and/or a combination thereof.

In a memory device such as 118, all of the stacked memory die may implement a first memory technology (e.g., DRAM); or alternatively one or more of the stacked memory die may include memory cells of a different storage technology different from the first memory technology. For example, one or more of the stacked memory die 108 could include an SRAM die, for example as a buffer providing an interface to DRAM die in the device. Alternatively, any of the above types of memory devices may be stacked in combination within memory device 118.

Additionally, memory device 118 depicts an alternative configuration in which the stacked memory die are stacked above an interface die 120. Interface die can be any of many different configurations, and when present, may implement logic functions relating to operation or management of the stacked memory die with which the interface die 120 is stacked. When present, the interface die 120 may include contacts 126 for interfacing with an interposer (as depicted in FIG. 1A), or other structure. In some embodiments, the contacts 126 may include micro-pillars. In many other examples, no interface die 120 will be present in the memory device, and the lowermost memory die 108A will include such contacts (126) for interfacing with an interposer or other structure. In many examples, contacts 126 will be arranged in one or more arrays configured to engage a respective mounting site on interposer 106.

In some examples, the vertically interconnected memory die 108A-108H may be interconnected through an array of TSVs extending essentially linearly and vertically through the stacked die 108 (though not necessarily through the uppermost stacked die 108H), as depicted at 122A, 122B, 122C, 122D, 122E. In one of many alternate configurations some TSVs through individual die may be cross-connected to interleave vertical connections through the stacked memory die. For example, in one such embodiment, as depicted, the conductive paths may alternate between TSV paths in alternate die within the stack, as schematically depicted at 124, in conductive paths 122F-122G. Other, more complex, interleaved conductive paths may also be implemented. In some examples, one or more of the conductive paths as will connect to each of the stacked memory die; while in other examples a vertical conductive path may only electrically connect to communicate with other circuitry in a subset of the stacked memory die. For example, in the context of memory device 118 some TSVs might extend directly through the lowermost memory die 108A-108D without connecting with other circuitry; and form electrical interconnections with circuitry only in the upper half of the stacked memory die 108E-108F. In other examples, TSVs might form electrical connections only with alternating die within a stack of memory die.

Additionally, individual memory die 108A-108H, or some portion thereof, may each contain multiple partitions (as indicated at 130A-130H on memory die 108H). Some or all of memory die 108A-108H may be partitioned similarly. These partitions (or some subset thereof), may be vertically interconnected with corresponding partitions of other memory devices in the stack through the above discussed vertical connections, forming an independently operable memory unit. In some examples, the memory unit can include two or more vertically aligned partitions; and in some examples may include vertically aligned partitions from all memory die in the stack. As indicated in partition 130A, each partition may be further subdivided into multiple banks or other subdivisions, such as individual memory channels. As one example, four banks (as indicated at 132A-132D, defining four banks) are formed within partition 130A, with each bank including further subdivided units, for example representing individual memory channels (indicated typically at 134). In some examples, these further subdivisions will be vertically interconnected in the same manner as described for the partitions to include portions of memory in multiple, or all, memory die in the stack, which may then be operated as a group.

Figure 2:
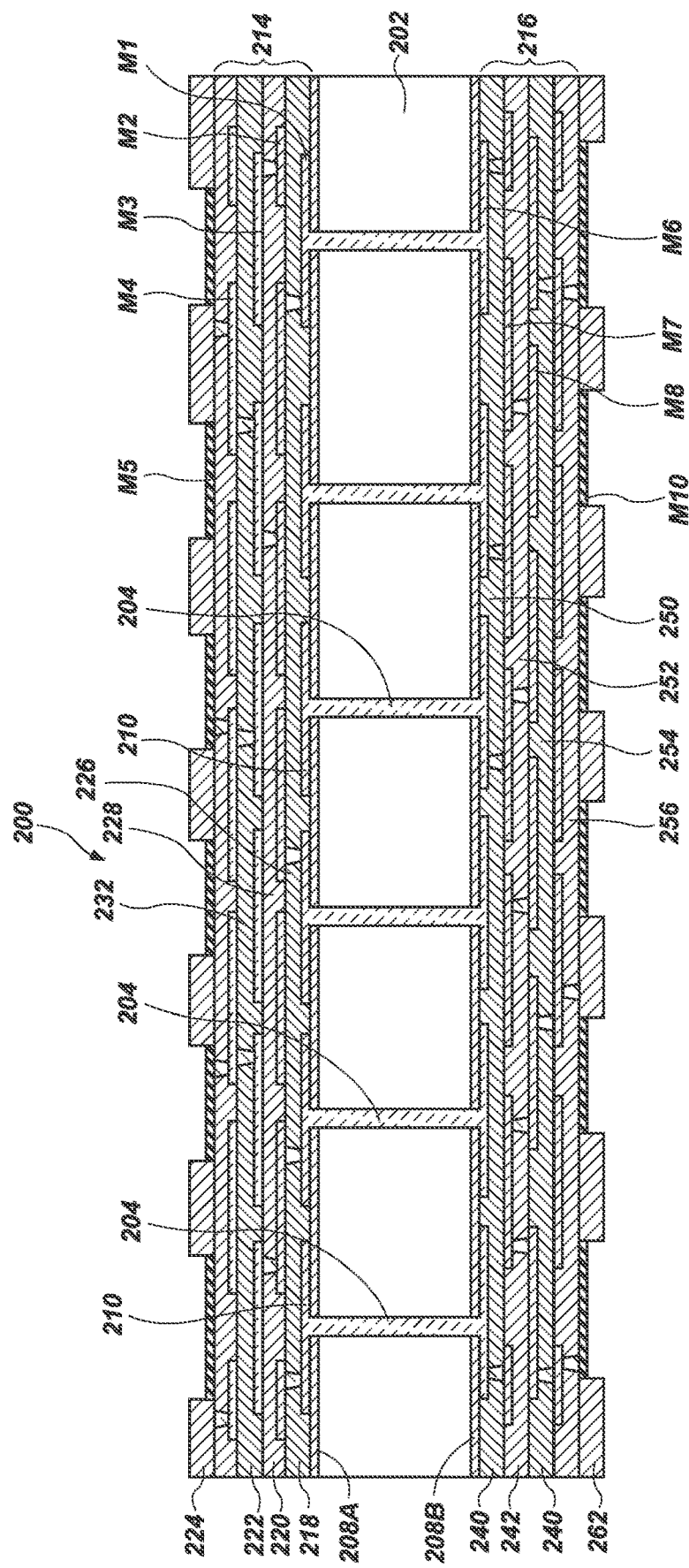
FIG. 2 depicts a simplified cross-sectional representation of a first example interposer.

Referring now to FIG. 2, the figure depicts a simplified cross-sectional representation of a first example interposer 200. Interposer 200 includes a semiconductor core, which for purposes of the present example will be described as a silicon core 202 having multiple TSVs 204 extending through silicon core 202. As is known to persons skilled in the art, TSVs 204 each include a conductive structure, commonly a metal, extending within an insulator isolating the conductive structure from the surrounding silicon. By utilizing a silicon core 200, TSVs can be arranged in a more compact spacing than would be feasible with current organic interposers technology. In some examples, for example, TSVs may be arranged at a pitch of 40 μm or less, for example, a pitch of approximately 20 μm. In many examples, the pitch of at least some portion of the TSVs will be sized to match a contact pitch of the semiconductor die or other devices coupled to interposer 200. In such examples, the contact pitch of TSVs can correspond to the contact pitch(s) of the die or other device coupled to interposer 200. In the depicted example, a conductive level (designated M1 and M6, respectively) extends "over" each respective side of core 202, each conductive level electrically insulated from the core 202 by a respective dielectric level 208A, 208B (which may include one or more dielectric materials). The term "over" is used in the present description for clarity, and refers to the material or level being relatively outward from the core 202. As will be recognized by persons of skill in the art, the materials and structures to one side of the core will typically be formed at different times, during which the respective side of the core over which a material is being formed will face directionally upward. Similarly, the term "under" is used herein to denote a structure closer to the core.

Conductive levels M1, M6 will in many examples be patterned to define conductive traces 210, at least some of which will interconnect with respective TSVs 204, as depicted. Some conductive traces 210 may not connect with respective TSVs, and may just provide interconnection for conductive traces formed above conductive levels M1, M6. The term "redistribution layer" or "RDL" is used in the industry in multiple contexts sometimes to refer to a single level of a multi-level structure, and sometimes to refer to the multi-level structure itself. Herein, for clarity, the term "redistribution layer" or "RDL" is used to refer to a respective dielectric level supporting a respective metal level (as discussed below); and the term "redistribution structure" or will be used to refer to multiple overlying individual RDLs as a group.

A first redistribution structure 214 is formed over a first side of core 202, and a second redistribution structure 216 is formed over an opposite, second, side of core 202. Each redistribution structure 214, 216 includes multiple respective redistribution layers (RDLs). Each of the multiple RDLs, in the example, each redistribution structure 214, 216 includes four RDLs. In redistribution structure 214, RDLs 218, 220, 222, 224, extend over a first side of core 202 and metal level MI formed thereon. Each RDL includes a respective dielectric level 226, 228, 230, 232, each dielectric level 226, 228, 230, 232 supporting a respective metal (or other conductive material) level M2, M3, M4, M5.

Redistribution structure 216 discloses a complementary structure including four RDLs, 240, 242, 246, 248, each including a respective dielectric level 250, 252, 254, 256 supporting a respective metal, or other conductive material, level M7, M8, M9, M10 extending over the second side of core 202 (and metal layer M6 formed there over). In the depicted example, each RDL metal level M2, M3, M4, M5, and M7, M8, M9, M10 forms vertical interconnects (for example, micro-vias) through the supporting dielectric level, to a metal level below. Each metal level M1-M10 will preferably be patterned to collectively form conductive traces to redistribute contacts of a semiconductor die or other microelectronic device or structure to desired locations.

In some examples, all metal layers M1-M10 may be formed of the same metal. In other examples, however, outermost metal layers M5 and M10 will typically form surfaces for connecting (directly or through an interconnection structure) with complementary contact structures of another device. In the case of top outermost metal layer M5, the layer will form surfaces suitable connecting with contacts of a semiconductor die, or other microelectronic device. In the case of bottom outermost metal layer M10, in many examples the layer will form contact surfaces configured to connect through other structures, such as contact balls (without any implication as to the actual shape of the contact structures), as may be used to connect with an external structure, in many cases, a printed circuit PC board, for example a motherboard of a computing system or other device. As a result of the different functions of these metal layers, and the likely exposure of the metal to potentially oxidizing environments after formation, in some examples one or both of the outermost metal layers may be formed of another conductive material that oxidizes more slowly than the metal used for used for other levels. For example, for examples in which metal layers M1-M4, and M6-M9 are formed of copper, one or both of outermost metal layers M5 and M10 may be formed of aluminum. As will be apparent to persons skilled in the art having the benefit of this disclosure, other conductive materials and/or other metals may be used for any one or more of conductive layers corresponding to M1-M10.

In many examples, the dielectric levels of the RDLs will be composed primarily, or in significant part, of a polyimide compound. In general, a polyimide compound will be more elastic, and less prone to cracking, than other dielectric materials used in other locations in semiconductor manufacturing (such as silicon oxide (in various forms), silicon nitride, etc.). Additionally, the polyimide material may be formed at lower temperatures than other materials used in build-up applications, thereby minimizing stress on core 202 during manufacture of interposer 200. The inclusion of multiple RDLs on each side of core 202 will help to stabilize core 202 against warping, cracking, or other distortions, and thereby improve the integrity of the microelectronic device assembly incorporating the interposer 200.

For some examples, it will be desirable to form interposer 200 with the same number of multiple interposers in redistribution structure 214 as are in redistribution structure 216. In some such examples, that symmetrical structure on both sides of the core may assist with balancing the above reinforcement of the semiconductor core. Also, as discussed later herein, in some examples the symmetrical structure may also be beneficial to conveying signals in multiple conductive channels (e.g., in some examples, with a first conductive channel implemented at least in part through metal layers M2-M5 in first redistribution structure 214, and a second conductive channel implemented at least in part through metal layers M7-M10 of second redistribution structure 216). Also as discussed later herein, there may be an unequal number of RDLs on opposite sides of the core, and individual RDLs may have vertical dimensions different than other RDLs on the same side of the core, and/or on the opposite side.

Figure 3:
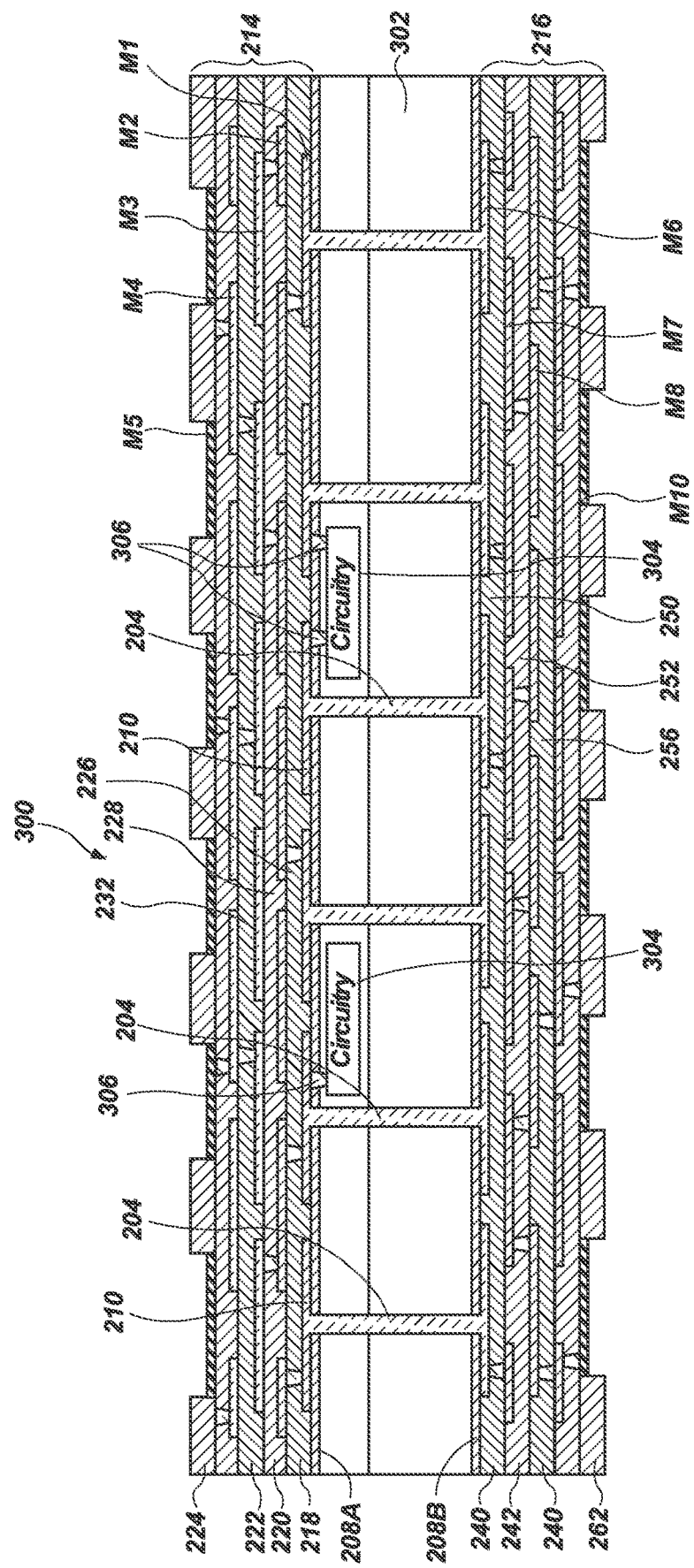
FIG. 3 depicts a simplified cross-sectional representation of a second example interposer.

Referring now to FIG. 3, the figure depicts a simplified cross-sectional representation of a second example interposer 300. Interposer 300 includes structures corresponding to those of interposer 200 of FIG. 2. Accordingly, the description of interposer 200 is applicable to interposer 300, and common elements to interposer 200 are numbered identically relative to interposer 300.

Where interposer 300 differs from interposer 200 is in having circuitry 304 formed within the dimensions of core 302. In some cases, circuitry 304 can include passive components (such as resistors, inductors, capacitors) that may be formed, at least in part, in the bulk semiconductor (silicon) of core 302. In other examples, the components may be formed, at least in part, of materials deposited in recesses formed in core 302. In some examples, the passive components may be formed entirely within the dimensions of the core. In such examples, individual circuit elements may connect outside of the core through interconnection to one or more TSVs 204 extending through core 302, or through one or more micro-vias 306 formed as a portion of M1 formed over the upper surface of core 302, and extending through dielectric level 308 over the first surface of core 302. In some cases, multiple passive components may be connected to one another. For example, resistors and capacitors may be coupled together to form a resistor/capacitor circuit. As one example, such a resistor/capacitor circuit, or an inductor, may be coupled and adapted to condition signals on conductive traces extending through one or more of the RDL layers of redistribution structure 214.

In some cases, it may be desirable to form active circuit components within the dimension of core 302. However, as discussed in more detail in reference to FIG. 6, many forms of circuitry including active components will beneficially be formed with one or more bodies within the bulk silicon of core 302, with one or more additional bodies formed in materials extending over core 302. In many forms of such devices, regions of silicon core 302 may be isolated from one another by shallow trench isolation in silicon core 302; and isolated regions of silicon core 302 may be doped relative to the remaining silicon of silicon core 302.

Figure 4:
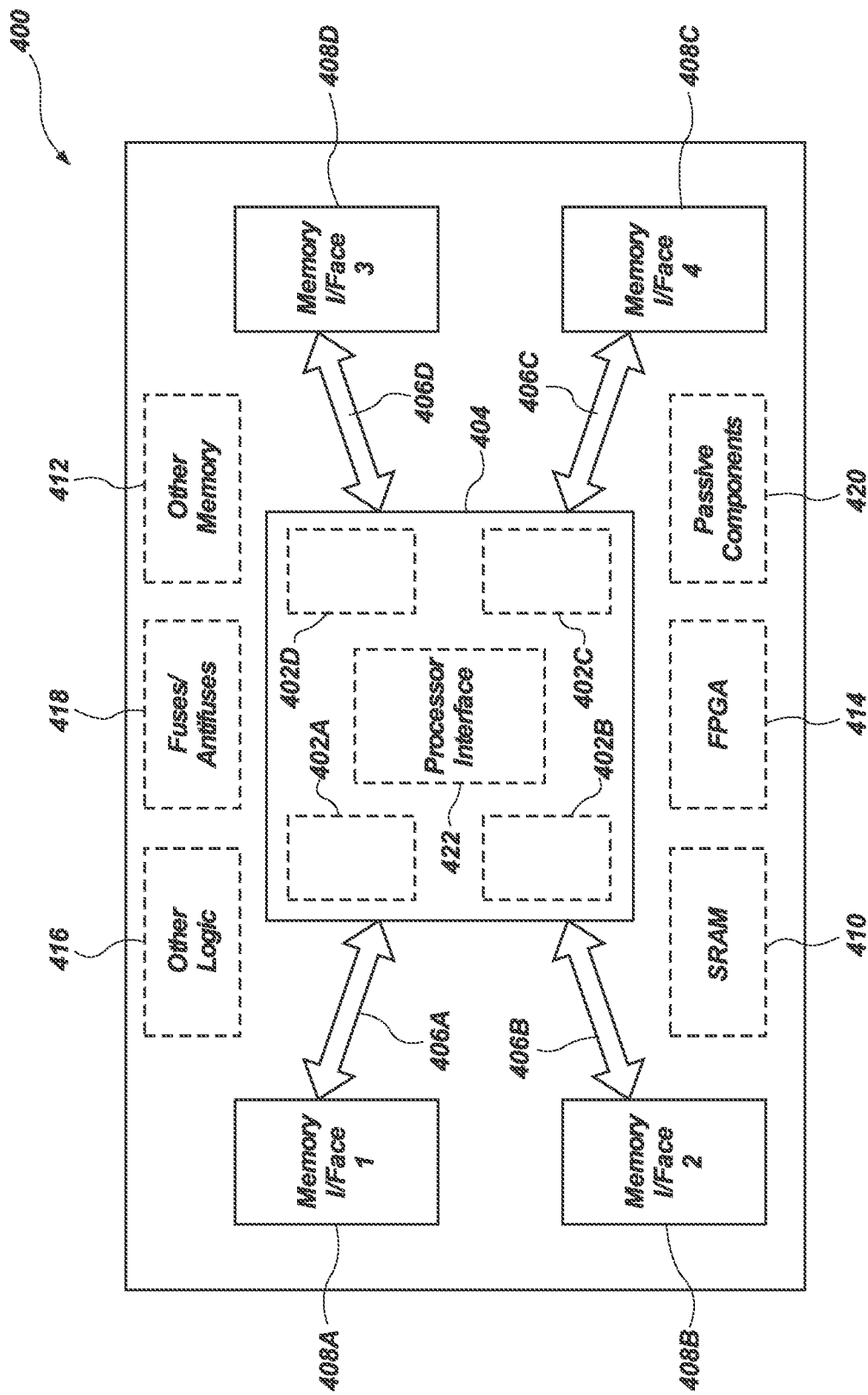
FIG. 4 depicts a block diagram representation of an example microelectronic device assembly that may be formed incorporating an interposer in accordance with the present description.

Referring now to FIG. 4, the figure depicts a block diagram representation of an example configuration for an interposer 400, including example optional circuit componentry may be formed in accordance with the description herein. Interposer 400 is analogous to interposer 106 of FIG. 1A, in that it defines one or more arrays of contacts (in the example, four) arranged to form processor interfaces 402A, 402B, 402C, 402D for four memory devices, as part of a processor interface 404. Each processor interface may communicate data, command, and control signals through a respective communication channel 406A, 406B, 406C, 406D extending to one or more arrays of contacts forming each of four memory interfaces 408A, 408B, 408C, 408D. The particular configuration of one or more arrays of contacts to form each processor interface 402A, 402B, 402C, 402D, and also each memory interface 408A, 408B, 408C, 408D can be adapted to a desired configuration, such as may be dictated by a standardized interface. Processor interface 404 may also include one or more arrays of contacts 422 to establish connections with other components and/or external structures.

The ability to configure interposer to include active and/or passive circuit components facilitates the forming of logic and/or additional structures within the interposer to simplify incorporating such circuit components into the microelectronic device assembly to be formed with interposer 400. For example, storage mechanisms (which will in many examples include the logic circuitry for operating the storage mechanism) may be formed in interposer 400. For example, a memory, such as SRAM 410 (which may be of any of various configurations known to the art) may be formed, or another form of memory 412, such as, by way of example only, any of DRAM, ferroelectric random-access memory (FeRAM), phase change memory (PCM), 3D XPoint™ memory, NAND memory, NOR memory, resistive random-access memory (ReRAM or RRAM), or other memory types known to persons skilled in the art, and/or a combination thereof.

Additionally, logic structures may be formed in interposer 400 which may be in the form of Field-Programmable Gate Arrays (FPGAs) 414, or other types of logic 416. Additionally, configuration circuitry, as may be used to tune or trim circuits or to enable or disable circuit components, such as fuses or anti-fuses, can be formed in interposer 400. And, as discussed previously passive circuit components 420, such as, for example components to condition signals traversing interposer 400 may also be formed.

For clarity of the block diagram representation, the different circuit components are depicted surrounding, but offset from, processor interface 404. However, the ability to incorporate such circuit components into interposer 400 facilitates placing the circuit components in a desired location within interposer 400. Any of the above memory, logic, or configuration circuitry can communicate through connected TSVs to the opposite side of interposer 400.

Referring now to FIG. 5, the figure depicts a simplified schematic representation of an example signal routing in an interposer 500 between multiple mounting sites and semiconductor components. Interposer 500 is depicted with a first device interface 502 configured to form a first mounting site for establishing connection with a first memory device 504; and a second device interface 506 forming a second mounting site for establishing connection with a second memory device 508. Each of first device interface 502 and second device interface 506 connect with respective contact arrays 510, 512 forming at least a portion of a third device interface 514, forming a third mounting site, such as for a processor 516. The conductive traces 520 extending transversely between device interface 506 and contact array 510 can be distributed between multiple RDLs 530 extending above core 526. Similarly, the conductive traces 522 extending transversely between device interface 502 and contact array 512, may connect to TSVs 532 extending through core 526, and through multiple RDLs 528, and then again through a second group of TSVs 524 to connect to contact array 512. The arrangement of contacts in each contact array and the configuration of the conductive traces may be configured to establish generally equal length conductive paths at least for selected conductive traces communicating with an individual memory device.

In some example constructions, the transverse traces of the two conductive channels may not extend directly one above the other, as depicted in FIG. 5. Where the transverse traces of a first conductive channel extend in a region of a redistribution structure in which there are no active transverse traces on the opposite side redistribution structure, it may be desirable to include "dummy" metallization in the opposite side redistribution structure to maintain, to the extent possible, symmetry of the physical properties of the two redistribution structures. Again, the objective being to avoid compositional variances that could impart stress to core 526.

FIG. 5 depicts external contacts, at the lower surface of interposer 500 providing contacts 528 (in the depicted example form of solder balls) to an external component 530. In many example configurations, external complement 530 will be a PC board or analogous structure serving to interconnect the assembly formed on interposer 500 within a larger electronic system, as identified and discussed relative to FIG. 7.

The incorporation of logic gates and memory into the structure of described interposers was previously identified. As was described, for many such structures, particularly those including active components, forming one or more bodies of the components in the silicon of the interposer core may be desirable, with one or more bodies of the components formed in materials formed over the core. An example manner of a structure incorporating such active components and related structures into the interposer core will be discussed in reference to FIG. 6.

Figure 6:
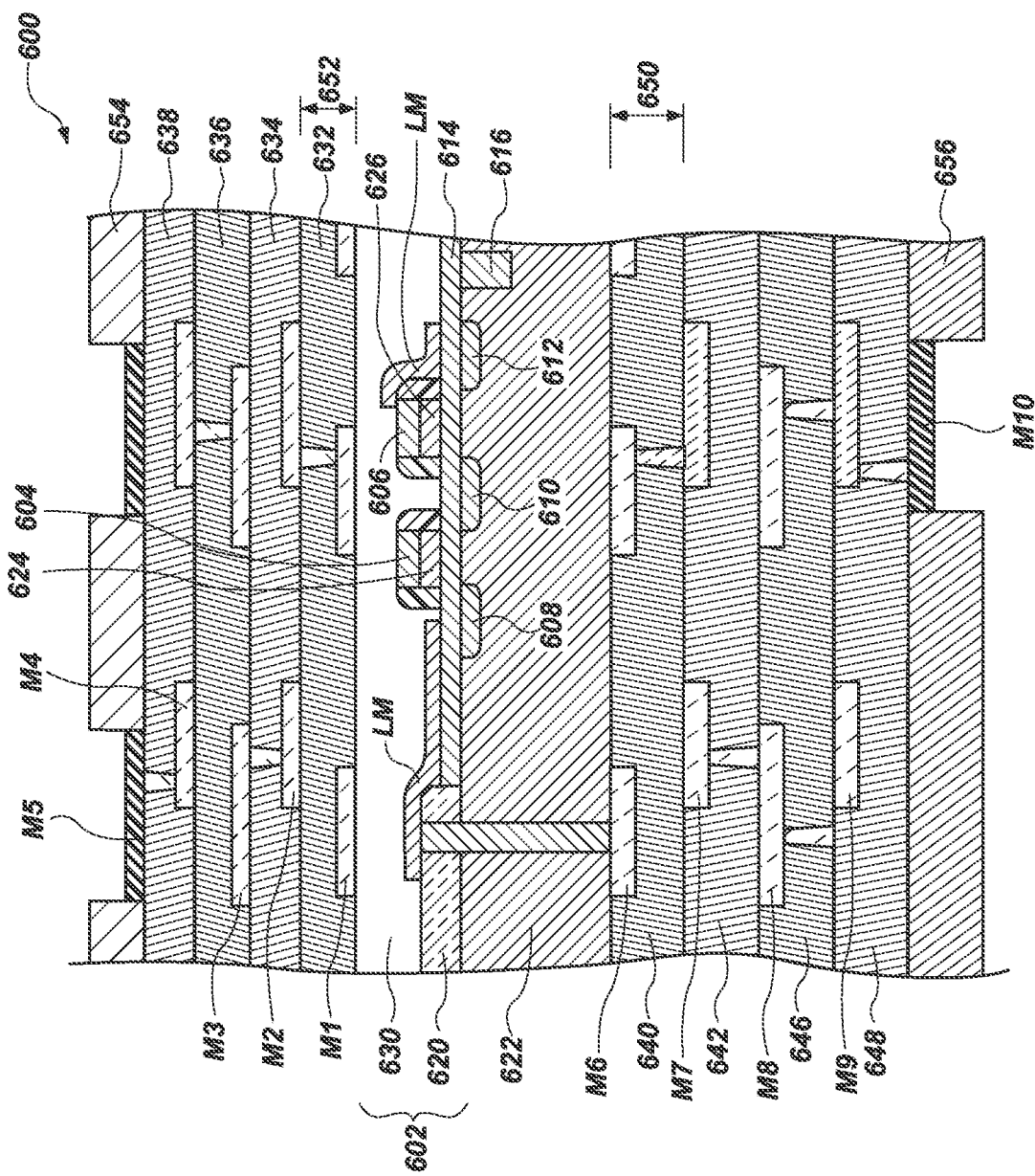
FIG. 6 depicts a simplified cross-sectional representation of a representative section of an additional embodiment of an interposer incorporating logic structures.

FIG. 6 depicts an example interposer 600 including circuit elements, including logic gates as previously discussed in reference to interposer 300 of FIG. 3.

FIG. 6 depicts a logic structure 602 formed above core 622. In the depicted example, logic structure 602 includes coupled transistors 604, 606. Each transistor 604, 606 includes source/drain regions 608, 610, 612 formed by doping selected regions of core 622. In some examples, in which such transistor gates are to be formed, it may be desirable to remove at least a portion of dielectric level 620 formed over silicon core 622, in order to form another dielectric material, indicated at 614, optimized to form a gate oxide for the transistors. In regions outside the logic gates, dielectric level 620 may remain intact. In some examples, it may be advantageous to isolate portions of silicon core 622 adjacent one or more circuit components, such as by forming shallow trench isolation, as indicated at 616 within silicon core 622. Forming of transistors 604, 606 can include forming one or more conductive gate materials 624, 626 (such as, for example, doped polysilicon) over the gate oxide 614; and isolating the sidewalls of the gates with spacers, as depicted. Also, as discussed previously, electrical connection between circuitry can be made with one or more conductive levels, such as one or more logic metal (LM) materials within the logic region. In order to provide a planar surface on which to form the previously-described RDLs, where, as in the example, the circuit components extend above the surface of silicon core 622, an insulating material 630, for example such as TEOS, may be formed above the logic circuitry and planarized.

Additionally, though not depicted for clarity, circuit components can also be formed on the opposite side of silicon core 622. The circuitry on the opposite side can either be similar to that on the first side, or of a different configuration.

In the example of interposer 600, in order to help promote stability and durability of silicon core 622, RDL layers 632, 634, 636, and 638 on the first side of core 622, and above logic structure 602 are all formed with a first vertical dimension, which in the example of interposer 600 is a uniform vertical dimension (indicated at 648) of those layers. However, in the depicted example, in view of the vertical dimension of logic structure 602 (including the insulating material above), in order to avoid imbalances on opposite sides of the core, each of the four RDL layers 640, 642, 644, 646 on the second side of core 622 have a greater vertical dimension (indicated at 650) than that of each of RDL layers 632, 634, 636, 638. This facilitates the structure formed on the first side of core 622, and the structure formed on the second side of core 622 to have a comparable, ideally (in this example) identical vertical dimension (within the tolerances of manufacturing). In other examples, one or more RDL layers on either side of the core may be constructed with a different vertical dimension from other RDL layers on that same side of the core and/or from RDL layers on the opposite side of the core.

Figure 7:
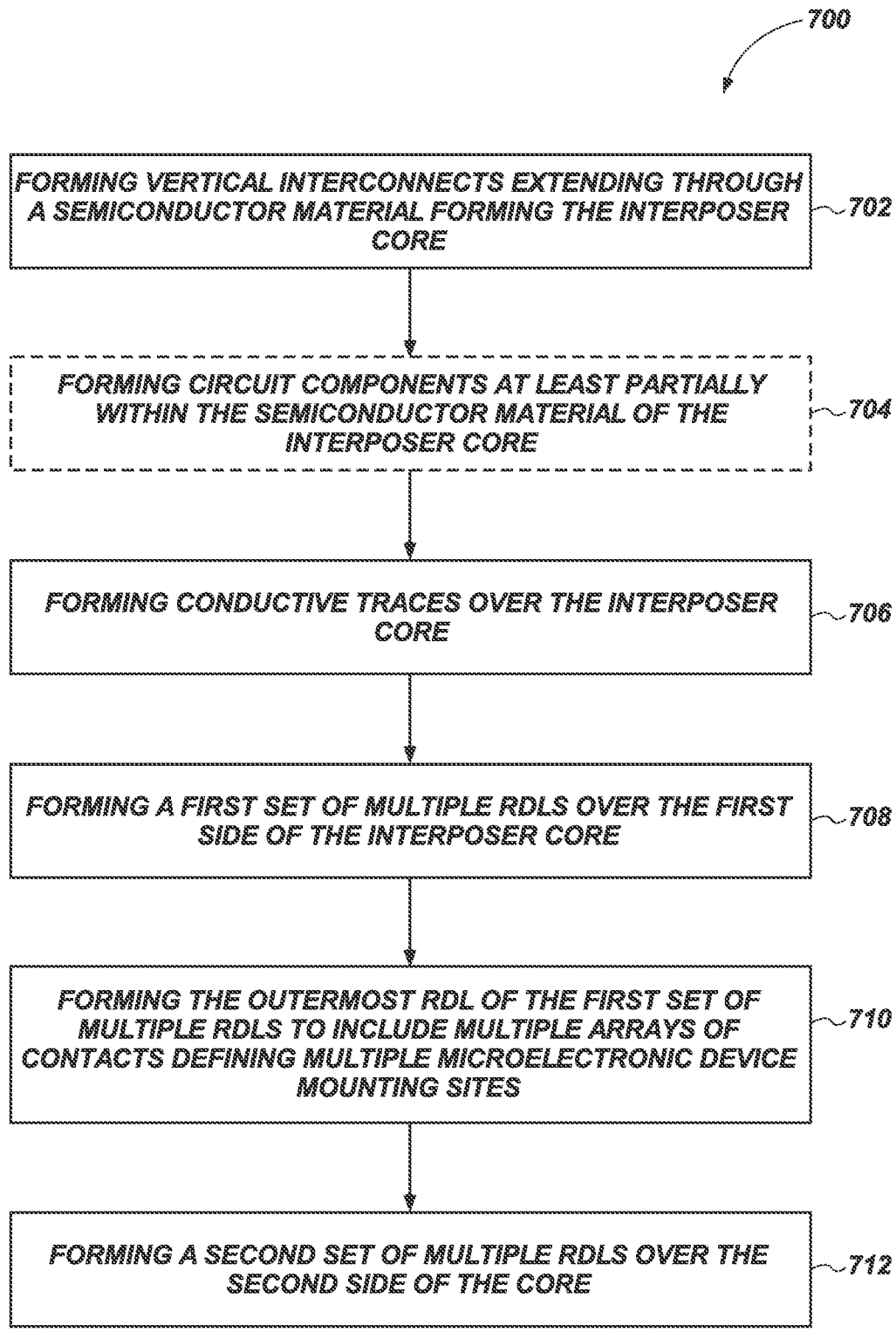
FIG. 7 depicts a flowchart of an example method for forming an interposer of configurations as described herein.

FIG. 7 depicts a flowchart of an example method for forming an interposer as described herein. As indicated at 702, multiple vertical interconnects will be formed extending through a semiconductor material forming the interposer core. These vertical interconnects can be in the form of TSVs as discussed above, and will be insulated from the interposer core. As indicated at 704, optionally, circuit components may be formed at least partially within the semiconductor material of the interposer core. The circuit components can be either active or passive, and in some cases will be formed, at least in part, above the surface of the interposer core; and isolated from structures above by a dielectric. In many examples, each TSV will terminate in conductive traces each side of the interposer core, to facilitate electrical coupling to components or other circuit traces that will be formed on each side of the core, as indicated at 706. In some examples, the traces formed on each side of the core may be formed prior to the optional forming of any circuit components.

As indicated at 708, a first set of multiple RDLs will be formed over the first side of the interposer core. The multiple RDLs will each electrically connect with a respective TSVs or other conductive traces to distribute electrical connections as desired. As indicated at 708, the outermost RDL of the first set of multiple RDLs can be configured to provide a raise of contacts for electrically and mechanically coupling multiple microelectronic devices (e.g., individual semiconductor die or assemblies including semiconductor die) at respective mounting sites on the interposer.

As indicated at 710, a second set of multiple RDLs will be formed over the second side of the interposer core. The second set of multiple RDLs may include the same or different number of RDLs as are present in the first set of RDLs, and each RDL may be of either the same or a different configuration as other RDLs within the second set and/or within the first set.

Figure 8:
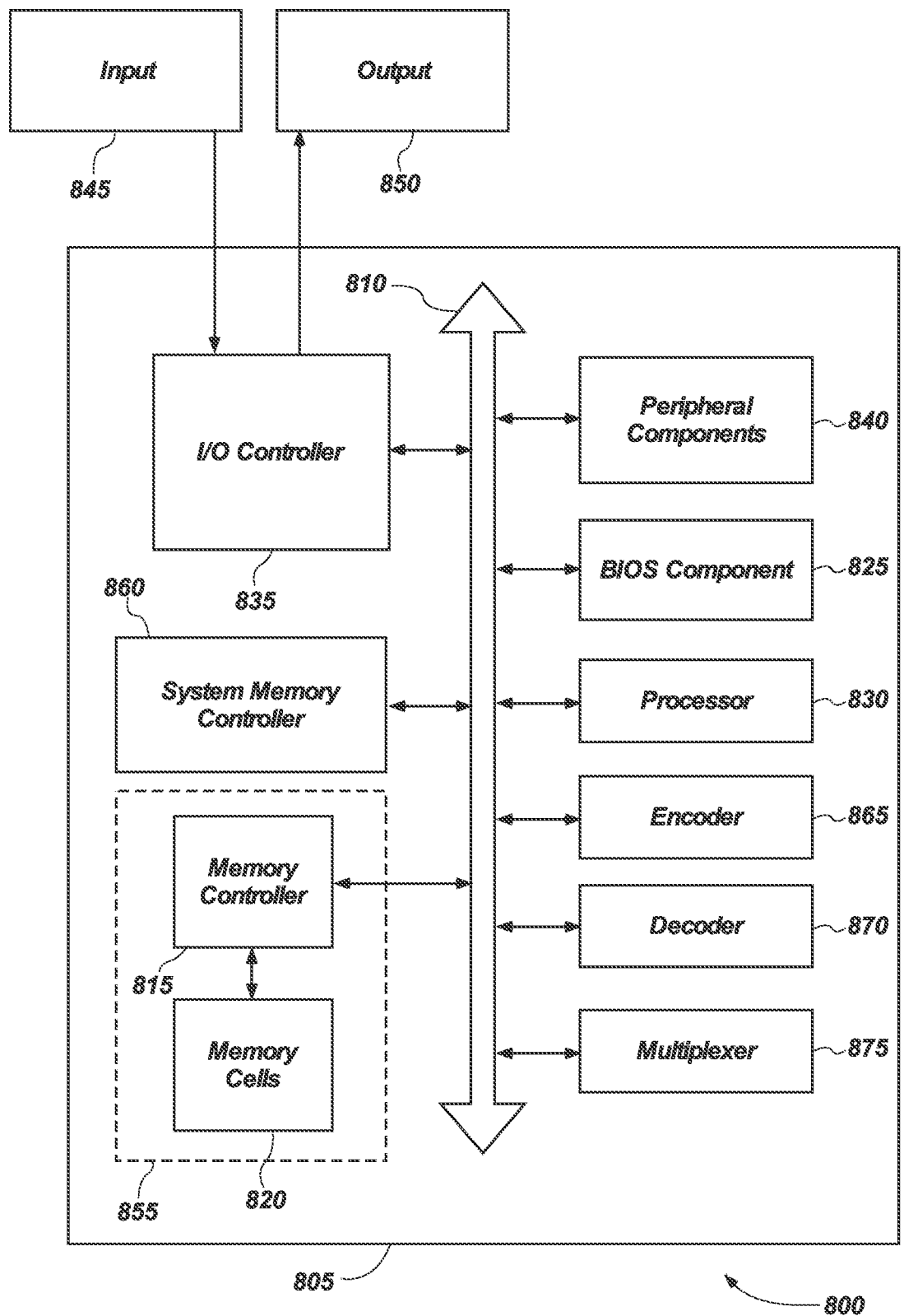
FIG. 8 depicts an example electronic system including components interconnected through an interposer having a structure providing high bandwidth communication channels, in accordance with aspects described herein.

FIG. 8 depicts a diagram of a system 800 including a device 805 that may include a microelectronic device assembly incorporating a silicon interposer such as any one or more of the examples herein. The interposer may be included, for example, to support multiple components of the example system, for example, processor 830 and memory device 855. Device 805 may include components for bi-directional voice and data communications including components for transmitting and receiving communications, including memory controller 815, memory cells 820, basic input/output system (BIOS) component 825, processor 830, I/O controller 835, peripheral components 840, memory chip 855, system memory controller 860, encoder 865, decoder 870, and multiplexer 875. These components may be in electronic communication via one or more busses (e.g., bus 810). Bus 810, for example, may have a bus width of 16 data lines ("DQ" lines). Bus 810 may be in electronic communication with 32 banks of memory cells.

Memory controller 815 or 860 may operate one or more memory cells as described herein. Specifically, memory controller may be configured to support flexible multi-channel memory. In some cases, memory controller 815 or 860 may operate a row decoder, column decoder, or both, as described with reference to FIG. 1. Memory controller 815 or 860 may be in electronic communication with a host and may be configured to transfer data during each of a rising edge and a falling edge of a clock signal of the memory controller 815 or 860.

Memory cells 820 may store information (i.e., in the form of a logical state) as described herein. Memory cells 820 may represent, for example, memory cells 105 described with reference to FIG. 1. Memory cells 820 may be in electronic communication with memory controller 815 or 860, and memory cells 820 and memory controller 815 or 860 may be located on a chip 855, which may be one or several planar memory devices as described herein. Chip 855 may, for example, be managed by system memory controller 815 or 860.

Memory cells 820 may represent a first array of memory cells with a plurality of regions coupled to a substrate. Each region of the plurality of regions may include a plurality of banks of memory cells and a plurality of channels traversing the first array of memory cells. At least one of the plurality of channels may be coupled to at least one region. Memory controller 815 or 860 may be configured to transfer data between the coupled region and the memory controller 815 or 860.

BIOS component 825 be a software component that includes BIOS operated as firmware, which may initialize and run various hardware components. BIOS component 825 may also manage data flow between a processor and various other components, e.g., peripheral components, input/output control component, etc. BIOS component 825 may include a program or software stored in read only memory (ROM), flash memory, or any other non-volatile memory.

Processor 830 may include an intelligent hardware device, (e.g., a general-purpose processor, a digital signal processor (DSP), a central processing unit (CPU), a microcontroller, an application-specific integrated circuit (ASIC), a field programmable gate array (FPGA), a programmable logic device, a discrete gate or transistor logic component, a discrete hardware component, or any combination thereof). In some cases, processor 830 may be configured to operate a memory array using a memory controller 815 or 860. In other cases, a memory controller 815 or 860 may be integrated into processor 830. Processor 830 may be configured to execute computer-readable instructions stored in a memory to perform various functions (e.g., functions or tasks supporting flexible multi-channel memory).

I/O controller 835 may manage input and output signals for device 805. I/O controller 835 may also manage peripherals not integrated into device 805. In some cases, I/O controller 835 may represent a physical connection or port to an external peripheral. I/O controller 835 may utilize an operating system such as iOS®, ANDROID®, MS-DOS®, MS-WINDOWS®, OS/2®, UNIX®, LINUX®, or another known operating system. In other cases, I/O controller 835 may represent or interact with a modem, a keyboard, a mouse, a touchscreen, or a similar device. In some cases, I/O controller 835 may be implemented as part of a processor. A user may interact with device 805 via I/O controller 835 or via hardware components controlled by I/O controller 835.

Peripheral components 840 may include any input or output device, or an interface for such devices. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots.

Input 845 may represent a device or signal external to device 805 that provides input to device 805 or its components. This may include a user interface or an interface with or between other devices. In some cases, input 845 may be managed by I/O controller 835, and may interact with device 805 via a peripheral component 840.

Output 850 may also represent a device or signal external to device 805 configured to receive output from device 805 or any of its components. Examples of output 850 may include a graphics display, audio speakers, a printing device, another processor, or printed circuit board, etc. In some cases, output 850 may be a peripheral element that interfaces with device 805 via peripheral component(s) 840. Output 850 may be managed by I/O controller 835.

System memory controller 815 or 860 may be in electronic communication with a first array of memory cells (e.g., memory cells 820). A host may be a component or device that controls or directs operations for a device of which memory controller 815 or 860 and corresponding memory array are a part. A host may be a component of a computer, mobile device, or the like. Or device 805 may be referred to as a host. In some examples, system memory controller 815 or 860 is a GPU.

Encoder 865 may represent a device or signal external to device 805 that provides performs error correction encoding on data to be stored to device 805 or its components. Encoder 865 may write the encoded data to the at least one selected memory via the at least one channel and may also encode data via error correction coding.

Decoder 870 may represent a device or signal external to device 805 that sequences command signals and addressing signals to device 805 or its components. In some examples, memory controller 815 or 860 may be co-located within decoder 870.

Multiplexer 875 may represent a device or signal external to device 805 that multiplexes data to device 805 or its components. Multiplexer 875 may multiplex the data to be transmitted to the encoder 865 and de-multiplex data received from the encoder 865. A multiplexer 875 may be in electronic communication with the decoder 870. In some examples, multiplexer 875 may be in electronic communication with a controller, such as system memory controller 815 or 860.

The components of device 805 may include circuitry designed to carry out their functions. This may include various circuit elements, for example, conductive lines, transistors, capacitors, inductors, resistors, amplifiers, or other active or inactive elements, configured to carry out the functions described herein. Device 805 may be a computer, a server, a laptop computer, a notebook computer, a tablet computer, a mobile phone, a wearable electronic device, a personal electronic device, or the like. Or device 805 may be a portion or aspect of such a device. In some examples, device 805 is an aspect of a computer with high reliability, mission critical, or low latency constraints or parameters, such as a vehicle (e.g., an autonomous automobile, airplane, a spacecraft, or the like). Device 805 may be or include logic for artificial intelligence (AI), augmented reality (AR), or virtual reality (VR) applications.

To better illustrate the methods and apparatuses described herein, a non-limiting set of example embodiments are set forth below as numerically identified Examples.

Example 1 is an interposer for a microelectronic device assembly, including: a core including a semiconductor material; multiple vertical contacts extending through the core; a first structure formed on a first side of the core, the first structure including multiple redistribution layers, each redistribution layer including, a dielectric level extending over and between conductive structures, multiple conductive traces supported on the dielectric level, and one or more vertical interconnects in contact with respective conductive traces and extending through the dielectric level; and a second structure formed on a second side of the core opposite the first side, the second structure, the second structure including multiple redistribution layers, each redistribution layer including, a dielectric level extending over and between conductive structures, multiple conductive traces supported on the dielectric level, and one or more vertical interconnects in contact with respective of the conductive traces and extending through the dielectric level.

In Example 2, the subject matter of Example 1 wherein a number of redistribution layers of the first structure is equal to a number of redistribution layers of the second structure.

In Example 3, the subject matter of any one or more of Examples 1-2 wherein the redistribution layers of the first structure have an equal number and vertical dimension to the redistribution layers of the second structure.

In Example 4, the subject matter of any one or more of Examples 1-3 optionally include circuit components formed at least in part in the semiconductor material of the core.

In Example 5, the subject matter of Example 4 wherein the circuit components comprise passive components formed in the semiconductor material of the core.

In Example 6, the subject matter of Example 5 wherein one or more of the passive components is coupled to at least one of a vertical interconnect of the first structure or a vertical contact extending through the core.

In Example 7, the subject matter of Example 6 wherein one or more of the passive components is coupled to at least one additional passive component.

In Example 8, the subject matter of any one or more of Examples 1-7 optionally include one or more circuit components formed partially in the semiconductor material of the core, and partially above the core.

In Example 9, the subject matter of Example 8 wherein the one or more circuit components comprise one or more active circuit components.

In Example 10, the subject matter of Example 9 wherein the first structure includes at least one additional level between the core and a closest adjacent redistribution layer; and wherein at least one active circuit component includes transistors include one or more bodies formed within the semiconductor material of the core, and one or more bodies formed in the additional level.

Example 11 is an interposer, including: mounting sites on a first surface of the interposer for multiple semiconductor device structures; contact structures on a second surface of the interposer forming electrical connections to other structures; a core including semiconductor material; multiple vertical contacts extending through the core; a first set of multiple redistribution layers formed one over a first side of the core; and a second set of multiple redistribution layers formed over a second side of the core opposite the first side.

In Example 12, the subject matter of Example 11 optionally includes multiple mounting sites on a first surface of the interposer for mounting multiple semiconductor device structures to the interposer.

In Example 13, the subject matter of Example 12 wherein the multiple mounting sites include one or more arrays of contacts forming a memory device interface.

In Example 14, the subject matter of Example 13 wherein the memory device interface is configured to couple with a memory device including multiple vertically stacked memory die.

In Example 15, the subject matter of Example 14 wherein the memory device interface defines a high-bandwidth memory interface.

In Example 16, the subject matter of any one or more of Examples 13-15 wherein the multiple mounting sites include one or more arrays of contacts forming a processor interface.

In Example 17, the subject matter of Example 16 wherein the interposer defines mounting sites forming first and second memory device interfaces, each mounting site including one or more arrays of contacts.

In Example 18, the subject matter of Example 17 wherein the contacts of the first and second memory device interfaces are connected through the first and second sets of multiple redistribution layers to contacts of the processor interface.

In Example 19, the subject matter of Example 18 wherein the contacts of the first memory device interface are connected to contacts of the processor interface through the first set of multiple redistribution layers; and wherein the contacts of the second memory device interface are connected to contacts of the processor interface through the second set of multiple redistribution layers.

In Example 20, the subject matter of any one or more of Examples 18-19 wherein contacts of at least one of the first and second memory device interfaces are connected to the second set of multiple redistribution layers through the vertical contacts extending through the core.

In Example 21, the subject matter of any one or more of Examples 11-20 optionally include circuit components formed at least partially in the semiconductor material of the core.

In Example 22, the subject matter of Example 21 wherein the circuit components comprise passive circuit components.

In Example 23, the subject matter of Example 22 wherein the passive circuit components formed entirely within the dimension of the semiconductor material of the core.

In Example 24, the subject matter of any one or more of Examples 22-23 wherein one or more of the passive components is coupled to at least one of a vertical interconnect of the first structure or a vertical contact extending through the core.

In Example 25, the subject matter of Example 24 wherein one or more of the passive components is coupled to at least one additional passive component.

In Example 26, the subject matter of any one or more of Examples 11-25 optionally include one or more circuit components formed partially in the semiconductor material of the core, and partially above the core.

In Example 27, the subject matter of Example 26 wherein the one or more circuit components comprise one or more active circuit components.

In Example 28, the subject matter of Example 27 optionally includes one or more intervening levels formed between the core and the first set of multiple redistribution layers; wherein one or more active circuit components is formed with at least a first body in the semiconductor material of the core, and a second body formed in an intervening level.

In Example 29, the subject matter of Example 28 wherein a first intervening level including a dielectric material extends between the core and a second intervening level in which the second body is formed.

In Example 30, the subject matter of any one or more of Examples 11-29 wherein the redistribution layers each comprise: a dielectric level extending over and between conductive structures; multiple conductive traces supported on the dielectric level; and one or more vertical interconnects in contact with respective conductive traces and extending through the dielectric level.

Example 31 is an interposer, including: mounting sites on a first surface of the interposer for multiple semiconductor device structures; contact structures on a second surface of the interposer configured to form electrical connections to other structures; a core including semiconductor material; multiple vertical contacts extending through the core; a first set of multiple redistribution layers formed one over a first side of the core; a second set of multiple redistribution layers formed over a second side of the core opposite the first side; and logic formed at least partially between the core and the first set of multiple redistribution layers.

In Example 32, the subject matter of Example 31 wherein the logic is formed at least partially in the core, and partially in materials extending above the core.

In Example 33, the subject matter of Example 32 wherein the logic comprises one or more memory arrays.

In Example 34, the subject matter of Example 33 wherein the one or more memory arrays comprise at least one of DRAM, NOR flash, NAND flash, SRAM, or 3D XPoint™ memory.

In Example 35, the subject matter of any one or more of Examples 32-34 wherein the logic comprises one or more of Field Programmable Gate Arrays (FPGAs), fuses, and anti-fuses.

In Example 36, the subject matter of any one or more of Examples 31-35 wherein the vertical dimension of the first set of multiple redistribution layers and the logic on the first side of the core is substantially equal to the vertical dimension of the second set of multiple redistribution layers on the second side of the core.

In Example 37, the subject matter of Example 36 wherein the first set of multiple redistribution layers and the second set of multiple redistribution layers each include the same number of redistribution layers; and wherein the vertical dimension of one or more of the redistribution layers of the second set is greater than the vertical dimension of one or more redistribution layers of the first set.

In Example 38, the subject matter of any one or more of Examples 36-37 wherein the second set of multiple redistribution layers includes a greater number of layers than the first set of multiple redistribution layers.

Example 39 is a method of forming an interposer for a microelectronic device assembly, including: forming vertical interconnects extending through a semiconductor material forming an interposer core; forming conductive traces over the interposer core; forming a first set of multiple redistribution layers over a first side of the core; forming a second set of multiple redistribution layers over a second side of the core opposite the first side.

In Example 40, the subject matter of Example 39 wherein an outermost redistribution layer of the first set of multiple redistribution layers is formed to include multiple arrays of contacts defining multiple microelectronic device mounting sites, each mounting site including at least one array of contacts.

In Example 41, the subject matter of any one or more of Examples 39-40 optionally include forming circuit components at least partially within the semiconductor material of the interposer core.

In Example 42, the subject matter of Example 41 wherein forming the circuit components includes forming passive components, including, forming one or more passive components entirely within the semiconductor material of the interposer core.

In Example 43, the subject matter of any one or more of Examples 39-42 wherein forming the circuit components includes forming active components, and forming one or more active components includes a first body in the semiconductor material of the interposer core and forming a second body in a material extending above the interposer core and beneath the innermost redistribution layer of the first set of multiple redistribution layers.

In Example 44, the subject matter of any one or more of Examples 39-43 optionally include forming logic at least partially between the core and the first set of multiple redistribution layers.

In Example 45, the subject matter of Example 44 wherein forming logic comprises forming one or more logic devices partially in the core and partially in one or more materials extending above the core.

In Example 46, the subject matter of any one or more of Examples 44-45 wherein forming logic comprises forming one or more memory arrays.

In Example 47, the subject matter of Example 46 wherein the one or more memory arrays comprise at least one of DRAM, NOR flash, NAND flash, SRAM, or X-point memory.

In Example 48, the subject matter of any one or more of Examples 44-47 wherein forming logic comprises forming an array of one or more of Field Programmable Gate Arrays (FPGAs), fuses, and anti-fuses.

Example 49 is a microelectronic device assembly, including: an interposer including, multiple mounting sites on a first surface of the interposer for multiple semiconductor device structures; contact structures on a second surface of the interposer forming electrical connections to other structures; a core including semiconductor material; multiple vertical contacts extending through the core; a first set of multiple redistribution layers formed one over a first side of the core; and a second set of multiple redistribution layers formed over a second side of the core opposite the first side a first semiconductor device structure coupled to a first mounting site of the multiple mounting sites; and a second semiconductor device structure coupled to a second mounting site of the multiple mounting sites.

In Example 50, the subject matter of Example 49 wherein the interposer defines a first communication channel between the first semiconductor device structure and the second semiconductor device structure.

In Example 51, the subject matter of any one or more of Examples 49-50 wherein the first semiconductor device structure comprises a semiconductor die.

In Example 52, the subject matter of any one or more of Examples 49-51 wherein the second semiconductor device structure comprises a memory device including multiple stacked and interconnected memory die.

In Example 53, the subject matter of any one or more of Examples 50-52 optionally include a third semiconductor device structure coupled to a third mounting site of the multiple mounting sites; and wherein the interposer defines a second communication channel between the first semiconductor device structure and the third semiconductor device structure.

In Example 54, the subject matter of Example 53 wherein the first communication channel extends transversely in the first set of redistribution layers, and wherein the second communication channel extends transversely in the second set of redistribution layers.

In Example 55, the methods of any of Examples 39-48 may be used to form interposers in accordance with any one or more of Examples 1-37.

In Example 56, any features in any of interposers of Examples 1-37 may be incorporated with one another.

In Example 57, the microelectronic device assembly of any of Examples 49-54 may include an interposer in accordance with any one or more of Examples 1-37.

In Example 58, the microelectronic device assembly of any of Examples 49-54 may include an interposer formed in accordance with the methods of any of Examples 39-48 and 55.

In Example 59, one or more of Examples 1-58 include a silicon interposer core.

In Example 60, one or more of Examples 11-37 include a non-organic core comprising one or more of a semiconductor material, a glass material, and a ceramic material.

In Example 61, one or more of Examples 1-54 include an interposer core comprising silicon.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

The term "horizontal" as used in this document is defined as a plane parallel to the conventional plane or surface of a substrate, such as that underlying a wafer or die, regardless of the actual orientation of the substrate at any point in time. The term "vertical" refers to a direction perpendicular to the horizontal as defined above. Prepositions, such as "on," "over," and "under" are defined with respect to the conventional plane or surface being on the top or exposed surface of the substrate, regardless of the orientation of the substrate; and while "on" is intended to identify a direct contact of one structure relative to another structure which it lies "on" (in the absence of an express indication to the contrary); the terms "over" and "under" are expressly intended to identify a relative placement of structures (or layers, features, etc.), which expressly includes—but is not limited to—direct contact between the identified structures unless specifically identified as such. Similarly, the terms "over" and "under" are not limited to horizontal orientations, as a structure may be "over" a referenced structure if it is, at some point in time, an outermost portion of the construction under discussion, even if such structure extends vertically relative to the referenced structure, rather than in a horizontal orientation.

The terms "wafer" and "substrate" are used herein to refer generally to any structure on which integrated circuits are formed, and also to such structures during various stages of integrated circuit fabrication. The following detailed description is, therefore, not to be taken in a limiting sense, and the scope of the various embodiments is defined only by the appended claims, along with the full scope of equivalents to which such claims are entitled.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. In the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. An apparatus, comprising:
an interposer including,
a core comprising a non-organic semiconductor material;
a first group of redistribution layers formed over a first side of the core;
a second group of redistribution layers formed over a second side of the core; and
multiple contacts extending through the core;
the interposer having a first surface including multiple arrays of contacts for establishing contact with respective semiconductor device structures,
the multiple arrays of contacts including,
at least first and second arrays of contacts each configured for establishing electrical communication with a respective stack of memory die, and
a third array of contacts configured for establishing electrical communication with an additional semiconductor device structure;
wherein the core includes multiple doped regions of the non-organic semiconductor material, the doped regions forming respective bodies of active circuit elements, and multiple doped regions of the non-organic semiconductor material forming respective bodies of one or more passive circuit elements;
wherein each redistribution layer comprises a dielectric material supporting a conductive material; and
wherein at least one active circuit element having a body formed in the non-organic semiconductor material is electrically coupled to a conductive material of a redistribution layer in one of the first and second groups of redistribution layers.

2. The apparatus of claim 1, wherein the first and second groups of redistribution layers contain an equal number of individual redistribution layers.

3. The apparatus of claim 1, wherein multiple contacts within the first array of contacts are in electrical communication with multiple respective contacts within the third array of contacts through traces of conductive material in one or more redistribution layers of the first and second groups of redistribution layers.

4. The apparatus of claim 1, wherein the core further includes shallow trench isolation regions between respective doped regions of the multiple doped regions.

5. The apparatus of claim 1, wherein the non-organic semiconductor material of the core comprises silicon.

6. The apparatus of claim 1, wherein the at least one active circuit element having a body formed in the non-organic semiconductor material comprises multiple active circuit elements coupled to form logic structures.

7. The apparatus of claim 6, wherein one or more active circuit elements having a respective body formed in the non-organic semiconductor material also includes a respective body formed in a material outside the core.

8. The apparatus of claim 7, wherein the one or more passive circuit elements comprises at least one of fuses and anti-fuses.

9. The apparatus of claim 6, wherein the core includes shallow trench isolation to isolate portions of the core adjacent one or more active circuit element bodies in the core.

10. The apparatus of claim 6, wherein one or more active circuit elements extend above the surface of the non-organic semiconductor material of the core and are covered by insulating material defining a planar surface on which either the first or second group of the redistribution layers is formed.

11. The apparatus of claim 10, wherein the array of memory cells comprises an array of SRAM memory cells.

12. The apparatus of claim 1, wherein the at least one active circuit element comprises an array of memory cells.

13. A microelectronic device assembly, comprising:
an interposer including, a core comprising a non-organic semiconductor material, and including multiple conductive through silicon vias (TSVs) extending through the non-organic semiconductor material;

multiple first redistribution layers (RDLs) on a first side of the core and multiple second redistribution layers formed over a second side of the core, wherein each redistribution layer comprises a dielectric material and traces formed of a conductive material;

the interposer having a first surface including at least first and second memory mounting sites, each memory mounting site including a respective contact array, the interposer further including an additional mounting site configured to engage an additional semiconductor device;

wherein the core includes,
multiple doped regions of the non-organic semiconductor material forming bodies of respective active circuit elements, and
multiple doped regions of the non-organic semiconductor material forming respective bodies of passive circuit elements;
wherein at least one active circuit element having a body formed in the non- organic semiconductor material is electrically coupled to a conductive material of a redistribution layer in at least one redistribution layer of the multiple first and second redistribution layers;

first and second stacks of memory devices respectively coupled to the first and second contact arrays; and an additional semiconductor device coupled to the interposer at the additional mounting site.

14. The microelectronic device assembly of claim 13, wherein the additional semiconductor device is a processor, and wherein the processor is coupled to the first and second stacks of memory devices through conductive traces of at least one RDL from at least one of the first multiple RDLs and the second multiple RDLs.

15. The microelectronic device assembly of claim 14, wherein the at least one active circuit element comprises a SRAM array, and wherein the SRAM array is located at least partially below the processor, and is electrically coupled to the processor at least in part through TSVs.

16. The microelectronic device assembly of claim 14, wherein the at least one active circuit element comprises multiple memory cells forming a cache memory array, and wherein the cache memory array is located at least partially below the processor, and is electrically coupled to the processor at least in part through TSVs and one or more RDLs.

17. The microelectronic device assembly of claim 13, wherein the passive circuit elements formed in the non-organic semiconductor material of the core comprise components selected from the group consisting of resistors, capacitors, and inductors, and wherein these components are configured to condition signals communicated over the conductive material of the redistribution layers between the memory devices and the additional semiconductor device structure.

18. The microelectronic device assembly of claim 13, wherein at least a portion of the multiple doped regions of the non-organic semiconductor material forming respective bodies of active circuit elements are bodies of transistors configured to operate as part of processor interface circuitry segment for data transfer with the processor.

19. The microelectronic device assembly of claim 18, wherein a first dielectric layer extends over a first portion of a first side of the non-organic semiconductor material of the core, and where a second dielectric extends over a second portion of the first side of the non-organic semiconductor material of the core, the second dielectric serving as a gate dielectric for the transistors having bodies formed in the non-organic semiconductor material of the core.

20. The microelectronic device assembly of claim 13, wherein the first multiple RDLs and the second multiple RDLs, have the same number of individual RDLs.

* * * * *